United States Patent
Linder et al.

(10) Patent No.: US 6,661,033 B2
(45) Date of Patent: Dec. 9, 2003

(54) LED WITH A COUPLING-OUT STRUCTURE

(75) Inventors: Norbert Linder, Grünthal (DE); Ralph Wirth, Regensburg (DE); Heribert Zull, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/331,924

(22) Filed: Dec. 30, 2002

(65) Prior Publication Data

US 2003/0122145 A1 Jul. 3, 2003

Related U.S. Application Data

(63) Continuation of application No. PCT/DE01/01953, filed on May 23, 2001.

(30) Foreign Application Priority Data

Jun. 30, 2000 (DE) .......................... 100 31 821

(51) Int. Cl.[7] .............................................. H01L 33/00
(52) U.S. Cl. ............................ 257/99; 257/98; 257/95; 257/93; 257/91; 257/81; 257/623; 438/40; 438/29
(58) Field of Search ................ 257/99, 98, 95, 257/93, 91, 81, 79, 623; 438/40, 29

(56) References Cited

U.S. PATENT DOCUMENTS

| | | | |
|---|---|---|---|
| 4,080,245 A | 3/1978 | Yamanaka et al. ............ | 257/93 |
| 4,864,370 A * | 9/1989 | Gaw et al. .................... | 357/17 |
| 5,087,949 A | 2/1992 | Haitz ........................... | 438/40 |
| 5,132,751 A | 7/1992 | Shibata et al. ................ | 257/93 |
| 5,162,878 A * | 11/1992 | Sasagawa et al. ............ | 257/88 |
| 5,260,588 A * | 11/1993 | Ohta et al. .................... | 257/93 |
| 5,814,839 A * | 9/1998 | Hosoba ........................ | 257/96 |
| 6,229,160 B1 * | 5/2001 | Krames et al. ................ | 257/94 |
| 6,504,180 B1 * | 1/2003 | Heremans et al. ............ | 257/98 |

FOREIGN PATENT DOCUMENTS

| | | |
|---|---|---|
| DE | 24 16 098 | 10/1975 |
| DE | 24 21 590 | 11/1975 |
| DE | 197 27 233 A1 | 1/1999 |
| DE | 199 11 717 A1 | 9/2000 |
| EP | 0 544 512 A1 | 6/1993 |
| GB | 2 326 023 A | 12/1998 |
| JP | 03027578 A * | 2/1991 |
| JP | 07202263 | 8/1995 |
| WO | WO 00/39860 | 7/2000 |

* cited by examiner

*Primary Examiner*—Nathan J. Flynn
*Assistant Examiner*—Remmon R. Fordé
(74) *Attorney, Agent, or Firm*—Laurence A. Greenberg; Werner H. Stemer; Ralph E. Locher

(57) ABSTRACT

On an upper side there is a structured output coupling layer with flanks which are aligned at an angle between 60° and 88° with respect to a layer plane and which form boundaries for output coupling areas provided for the emergence of radiation and offset from one another. The output coupling areas are formed as flat truncated cones and can be rippled or zigzagged at the flanks, in order to increase the probability that the radiation produced strikes an outer interface of the output coupling layer more steeply than at a limiting angle of total reflection.

9 Claims, 3 Drawing Sheets

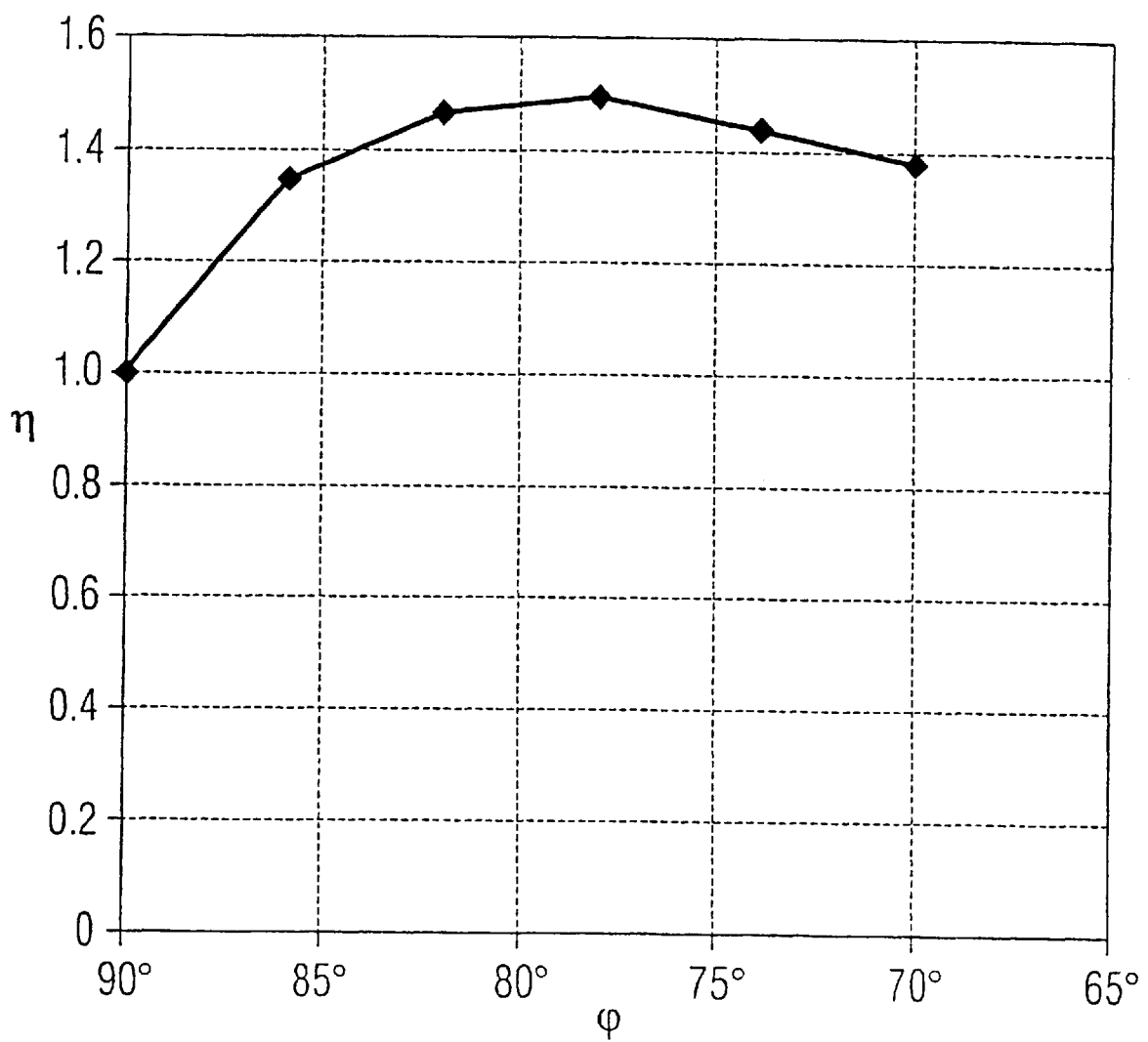

LED WITH A COUPLING-OUT STRUCTURE

CROSS-REFERENCE TO RELATED APPLICATION

This application is a continuation of copending International Application No. PCT/DE01/01953, filed May 23, 2001, which designated the United States and was not published in English.

BACKGROUND OF THE INVENTION

Field of the Invention

The present invention relates to an LED with an output coupling structure that increases efficiency.

In conventional LEDs, the radiation-producing area generally extends as an active layer over an entire layer plane or a strip-like area of a layer plane. On the front side of the component there is normally a connecting contact (bond pad) for current injection. The opposing electrode can be applied to the rear of the substrate, as a contact metallization over the entire area, or can be formed by a contact which is applied laterally to a radiation-producing strip on the front side and is connected to the underside of the active layer via suitably disposed, electrically conductively doped areas. In the case of surface-emitting LEDs or in the case of edge-emitting and surface-emitting LEDs, an output coupling layer can be disposed on the front side, which improves the coupling of light out of the chip.

The radiation produced is intended to be coupled as directly as possible out of the LED. Since the semiconductor material has a higher refractive index (typically 3.5) than the surrounding air or another transparent material that adjoins the semiconductor material (for example a resin with a refractive index of typically 1.5), total reflection occurs in the event of inadequately steep incidence of the radiation on the interface. The radiation is repeatedly reflected in the interior of the semiconductor material and leaves the LED only after a considerable reduction in the radiation power. In the case of box-shaped commercially available LEDs, a ray that does not strike the interface within the limiting angle of the total reflection with regard to the perpendicular which, in the numerical example specified, is around 25.38°, can be repeatedly reflected at the same angle at the mutually opposite interfaces and can finally be absorbed in the area of a contact or an active zone or in the substrate. The application of a thick semiconductor layer to the upper side of the LED supplies a structure in which the radiation has a higher probability of striking the side faces (edges) of the component at an angle that is sufficiently steep to emerge from the semiconductor material.

Published, Non-Prosecuted British Patent Application GB 2 326 023 A, corresponding to U.S. Pat. Nos. 6,323,063 and 6,229,160, includes a description of a radiation-producing semiconductor component in which the outer side faces form an oblique angle with respect to the plane of the active layer. This results in radiation being produced, in the event of total reflection at the side faces, that is deflected into a ray direction which runs largely perpendicular to the flat upper side of the component, so that the radiation can emerge here. It is therefore possible for the major part of the radiation produced to be coupled out of the LED after at most one total reflection, which increases the light yield.

U.S. Pat. No. 5,087,949 includes a description of an LED with a semiconductor body with beveled flanks. The n-conductively doped semiconductor body is transparent to the radiation and, on the rear, is provided with a p-conductively doped layer. The current injection into the pn junction is carried out via contacts on the front and rear. The rear contact adjoins the p-doped layer in a small central area and is otherwise isolated from the layer by an isolation layer. In this way, the current path is limited to the central area of the diode. The radiation produced only in the central area therefore passes to the front side of the LED and strikes the oblique flanks formed in the semiconductor body at very steep angles in each case, which makes it possible to couple the radiation immediately out of the semiconductor material.

SUMMARY OF THE INVENTION

It is accordingly an object of the invention to provide an LED with an coupling-out structure that overcomes the above-mentioned disadvantages of the prior art devices of this general type, in which the output coupling of the radiation is improved.

With the foregoing and other objects in view there is provided, in accordance with the invention, an LED. The LED contains a first layer electrically conductively doped with a first conductivity type, a second layer electrically conductively doped with a second conductivity type being opposite to the first conductivity type, and an active layer provided for radiation production disposed between the first and second layers. The active layer, the first layer and the second layer define a layer sequence having an upper surface. An output coupling layer is disposed on the upper surface and is provided for emergence of the radiation. The output coupling layer has and is bounded by lateral flanks defining at least two output coupling areas corresponding to mutually offset proportions of the output coupling layer. An angle formed between the lateral flanks and a plane of the output coupling layer lies between 45° and 88°. Two contacts, including a first contact disposed on the output coupling layer and a second contact disposed on the layer sequence, are provided for electrical connections.

In the LED according to the invention, there is formed the structured output coupling layer on the upper side. The lateral edges of the output coupling layer form flanks which are aligned with respect to the layer plane at an angle between 45° and 88°, preferably between 60° and 88°. The output coupling layer has a plurality of the output coupling areas which are provided for the emergence of radiation and which are offset from one another. The output coupling areas can in each case be bounded substantially circularly and form flat truncated cones with level upper and lower interfaces of the output coupling layer. The radiation-producing areas of the active layer are preferably limited to areas that, in a projection perpendicular with respect to the layer plane, in each case lie within the circular boundary of the relevant output coupling area. If the radiation-producing areas are not bounded in this or a similar way, the flanks of the output coupling layer at the edges of the output coupling areas preferably run at alternately acute and obtuse angles or are provided with zigzags that narrow in the manner of a taper or without outward and inward bulges.

In accordance with an added feature of the invention, means are provided for limiting the radiation production in accordance with the output coupling areas. The means for limiting the radiation production limits the active layer laterally to at least two mutually separated radiation-producing areas. Alternatively, the means for limiting the radiation production includes lateral limitation of the first contacts each applied to the output coupling layer in an area of one of the at least two output coupling areas being at least two mutually separated output coupling areas.

In accordance with an additional feature of the invention, the means for limiting the radiation production includes a pn junction interrupted into at least two mutually separated areas and blocks in an envisaged current direction, the means being disposed in the layer sequence.

In accordance with a further feature of the invention, the means for limiting the radiation production includes an electrically insulating layer interrupted in at least two mutually separated areas, the electrically insulating layer is disposed in the layer sequence.

In accordance with another feature of the invention, the output coupling layer has a form of truncated cones in the output coupling areas.

In accordance with a further added feature of the invention, the lateral flanks of the output coupling layer are in a form of zigzags defining a star shape in the output coupling areas and narrow in a manner of a taper.

In accordance with a concomitant feature of the invention, the angle formed between the lateral flanks and the plane of the output coupling layer lies between 60° and 88°.

Other features which are considered as characteristic for the invention are set forth in the appended claims.

Although the invention is illustrated and described herein as embodied in an LED with a coupling-out structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a graph showing the dependency of output coupling efficiency on a flank angle.

DESCRIPTION OF THE PREFERRED EMBODIMENTS

Figure 1:
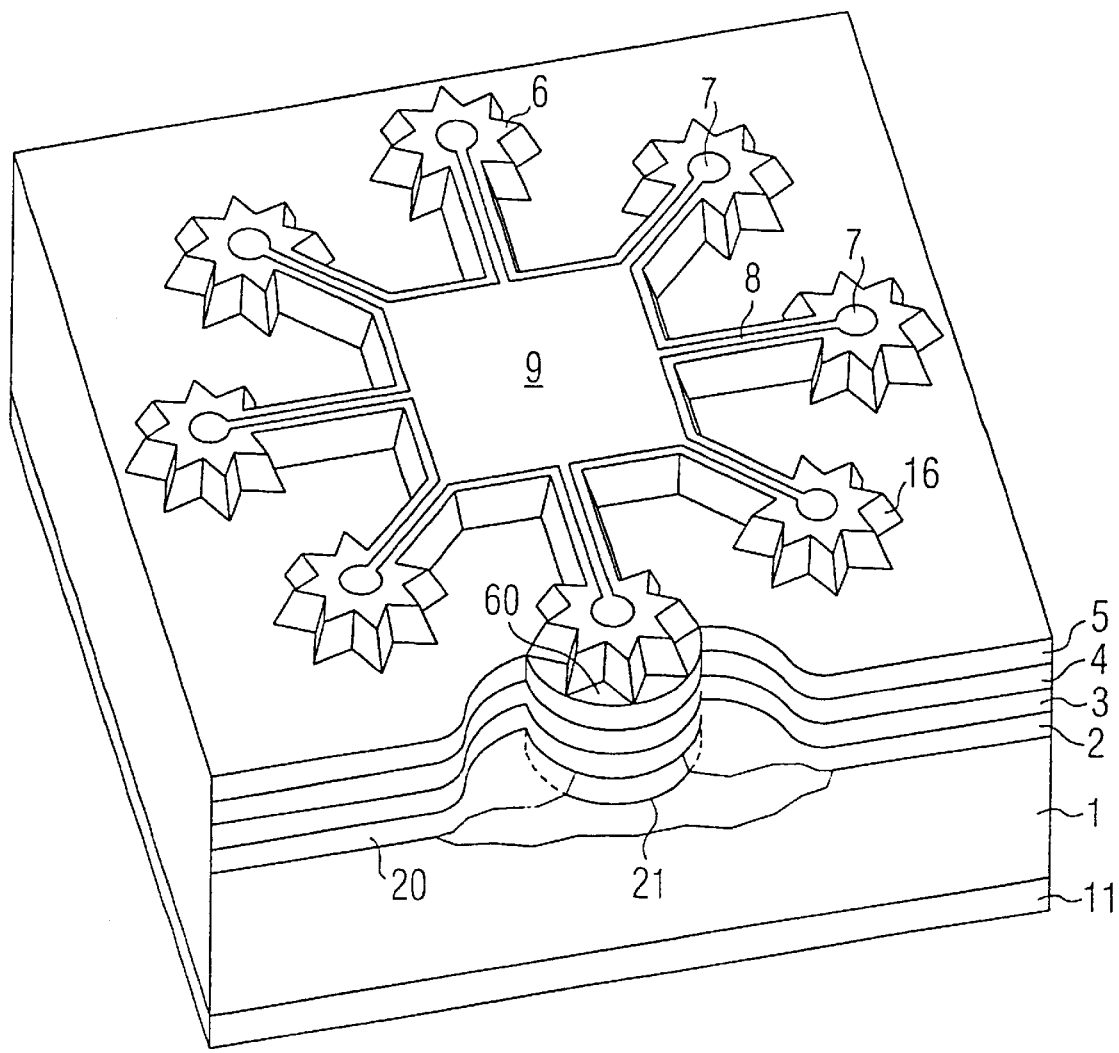
FIG. 1 is a perspective, cut-away view of an exemplary embodiment of an LED according to the invention.

Referring now to the figures of the drawing in detail and first, particularly, to FIG. 1 thereof, there is shown an LED in which, on a substrate 1, for example of GaAs, there is a layer structure which, in this example, contains a current limiting layer 2, a sheathing layer 3, an active layer 4, a covering layer 5, and an output coupling layer 6. On a rear of the substrate 1, there is a rear contact 11 for current injection. On an upper side of the output coupling layer 6 there is a connecting face 9 having respective feed lines 8 to individual contacts 7 associated with respective output coupling areas 60.

The semiconductor material between the contacts 7 and the active layer 4 is doped for electrical conductivity of a first conductivity type, at least in the areas envisaged for the production and output coupling of radiation. The semiconductor material between the active layer 4 and the rear contact 11 is doped for electrical conductivity of an opposite, second conductivity type. The active layer 4 can be undoped or doped with either of the two conductivity types. The substrate 1 is, for example, n-conductively doped and the covering layer 5 is p-conductively doped, at least in the output coupling area 60. Outside the output coupling areas 60, the covering layer 5 can be configured to be insulating. A further passivation layer, not shown, can be applied to the surface of the LED, on the covering layer 5 and at the side of the output coupling areas 60. The covering layer 5 can also be left out if the output coupling layer 6 is provided as an upper boundary of the active layer 4. Furthermore, the output coupling layer 6 can also enclose all or some of the layers 2 to 5.

At least in the areas provided with the contacts 7, the output coupling layer 6 is highly doped with the first conductivity type ($p^+$-conductive in the example), in order to achieve a good metal-semiconductor contact. If necessary, a thin, highly doped contact layer can be disposed between the output coupling layer 6 and the respective contact 7.

The output coupling layer 6 has a plurality of the output coupling areas 60, eight in the example of FIG. 1, which are offset from one another and in which flanks 16 are zigzagged in a star shape. The output coupling layer 6 narrowing in the manner of a taper in each zigzag. With a structure zigzagged or rippled in this way, in most cases a ray, after at most one total reflection, will strike one of the faces of the flanks 16 at a sufficiently steep angle in order to be able to emerge from the semiconductor material.

The radiation production in the active layer 4 is preferably limited within the output coupling areas 60 or in a narrow region around the output coupling areas 60. This can be done by the active layer 4 being formed only in some areas, so that the radiation is produced only in the projection of the output coupling areas 60 which is perpendicular with respect to the layer planes. The limitation of radiation production in the example illustrated in FIG. 1 is also achieved with an active layer 4 extending over the entire surface and in that the contacts 7 provided for the current injection into the active layer 4 have small lateral dimensions. In addition, the covering layer 5 outside the respective output coupling areas 60 can be configured to be insulating (for example by suitable implantation) or intrinsically conductive and exhibit good conductivity only in the output coupling areas 60. In the section illustrated in FIG. 1, this is indicated by the vertical lines in the strip that represents the covering layer 5. Located there is the boundary of the output coupling areas 60 present under the star-shaped structure of the output coupling layer 6.

A further possible way of delimiting the current path results from the current limiting layer 2, although this is not necessarily present. The current limiting layer 2 has a blocking area 20 which is disposed outside an envisaged boundary 21 of the current path and which is either non-conductive or is doped with the first conductivity type. In the latter case, together with the lower sheathing layer 3, which is doped for electrical conductivity of the second conductivity type, a pn junction that blocks in the current direction is formed.

As a result of the delimitation of the current path, the radiation production is limited to areas underneath the structured proportions of the output coupling layer 6. Examples given for this purpose are a) the lateral limitation of the active layer 4, b) the lateral limitation of the contact 7 applied to the output coupling layer, c) an isolating layer produced outside the output coupling areas and d) a blocking pn junction disposed outside the output coupling areas. The isolating layer can also be formed as a structured oxide layer that, for example, is obtained by oxidizing some areas of a semiconductor layer. Other methods of current limitation that are known per se in conventional components can likewise advantageously be used in the LED according to the invention in order to restrict the radiation production to the output coupling areas.

Figure 2:
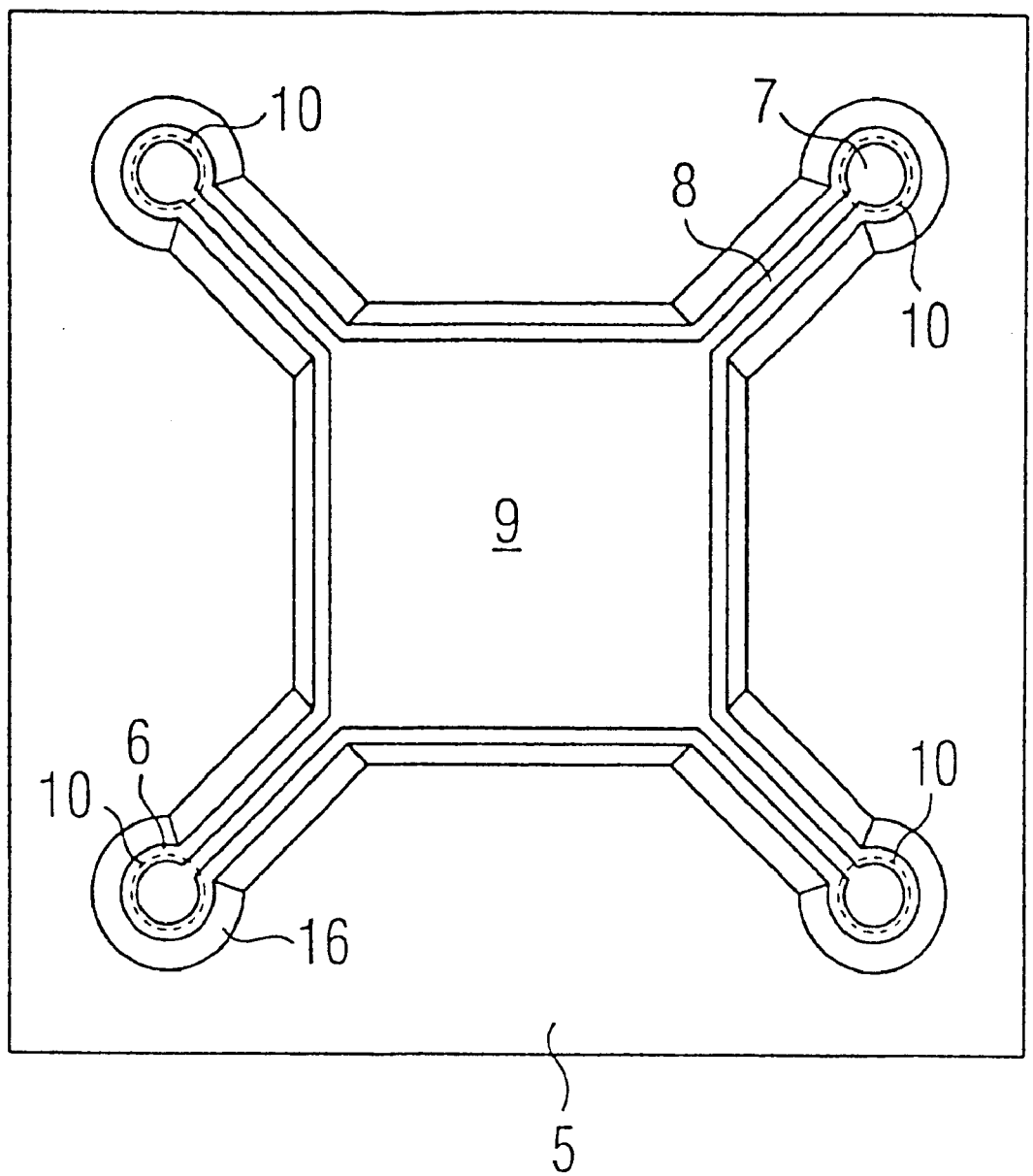
FIG. 2 is a plan view of a further exemplary embodiment of the LED.

FIG. 2 shows an exemplary embodiment that is preferably implemented with a local delimitation of the radiation production, in a plan view. Here, only four output coupling areas are provided, which are provided with a respective contact 7 which is connected via a respective feed line 8 to the central connecting face 9. The area of the radiation production is limited to the proportions of the output coupling layer 6 which are provided with the steep flanks 16, by the active layer 4 and/or the current path being limited to the areas 10 shown. The output coupling areas are substantially circular here, so that the relevant proportions of the output coupling layer form truncated cones. The outer surfaces of the truncated cones have an inclination between 45° and 88°, preferably between 60° and 88° with respect to the layer plane.

The respective number of output coupling areas is not fixed. It is possible for a plurality of connecting faces 9 to be present on one LED, so that a relatively large number of output coupling areas can be integrated in an LED. This has the advantage that the output coupling layer can be structured more finely and more complexly, in order to achieve a higher efficiency in coupling out the radiation. Instead of the structure illustrated in the exemplary embodiment of FIG. 1, having zigzags that narrow in the manner of a taper at the edge of the output coupling layer 6, there may be a similar structure having successively convex and concave rounded shaping of the flanks. For the configuration according to the invention, it is important that the angle formed between the flank of the output coupling layer and the layer plane lies between 45° and 88°, preferably between 60° and 88°, and there are at least two output coupling areas offset from one another. Otherwise, the structure of the LED can correspond to a conventional component; in particular, instead of a rear contact, a further contact can be applied to the upper side of the LED, being electrically conductively connected to the sheathing layer 3 or a corresponding layer.

In order to illustrate the influence of the angle formed between the flank of the output coupling layer and the layer plane, FIG. 3 shows a graph that represents a dependency of the output coupling efficiency η on the angle formed between the flank of the output coupling layer and the layer plane, in the range between 90° and 70°.

The angle formed between the flank of the output coupling layer and the layer plane is designated by φ in FIG. 3. The output coupling efficiency is plotted in arbitrary units.

FIG. 3 represents the results of calculations that were carried out on the basis of the exemplary embodiment illustrated in FIG. 1. However, only the angular range between 90° and 70° is illustrated in FIG. 3. By using FIG. 3 and by extrapolation to angles φ below 70°, it can be seen that a particularly high output coupling efficiency results for angles φ between 88° and 60°. However, the output coupling efficiency is always still high if the angle φ lies in the range between 45° and 88°.

We claim:

1. An LED, comprising:
    a first layer electrically conductively doped with a first conductivity type;
    a second layer electrically conductively doped with a second conductivity type being opposite to said first conductivity type;
    an active layer provided for radiation production disposed between said first and second layers, said active layer, said first layer and said second layer defining a layer sequence having an upper surface;
    an output coupling layer disposed on said upper surface and provided for emergence of the radiation, said output coupling layer having and bounded by lateral flanks defining at least two output coupling areas corresponding to mutually offset proportions of said output coupling layer, an angle formed between said lateral flanks and a plane of said output coupling layer lying between 45° and 88°; and
    two contacts, including a first contact disposed on said output coupling layer and a second contact disposed on said layer sequence, providing electrical connections.

2. The LED according to claim 1, further comprising means for limiting the radiation production in accordance with said output coupling areas.

3. The LED according to claim 2, wherein said means for limiting the radiation production includes limiting said active layer laterally to at least two mutually separated radiation-producing areas.

4. The LED according to claim 2, wherein:
    said first contact is one of a plurality of first contacts, one of said first contacts disposed in an area of each of said output coupling areas; and
    said means for limiting the radiation production includes lateral limitation of said first contacts each applied to said output coupling layer in an area of one of said at least two output coupling areas being at least two mutually separated output coupling areas.

5. The LED according to claim 2, wherein said means for limiting the radiation production contains a pn junction interrupted into at least two mutually separated areas and blocks in an envisaged current direction, said pn junction formed in said layer sequence.

6. The LED according to claim 2, wherein said means for limiting the radiation production includes an electrically insulating layer interrupted in at least two mutually separated areas, said electrically insulating layer disposed in said layer sequence.

7. The LED according to claim 1, wherein said output coupling layer has a form of truncated cones in said output coupling areas.

8. The LED according to claim 1, wherein said lateral flanks of said output coupling layer are in a form of zigzags defining a star shape in said output coupling areas and narrow in a manner of a taper.

9. The LED according to claim 1, wherein said angle formed between said lateral flanks and said plane of said output coupling layer lies between 60° and 88°.

* * * * *